(12) United States Patent
Nashida et al.

(10) Patent No.: US 10,068,870 B2
(45) Date of Patent: Sep. 4, 2018

(54) SEMICONDUCTOR DEVICE INCLUDING A CONNECTION UNIT AND SEMICONDUCTOR DEVICE FABRICATION METHOD OF THE SAME

(71) Applicant: FUJI ELECTRIC CO., LTD., Kawasaki-shi (JP)

(72) Inventors: Norihiro Nashida, Nagano (JP); Hideyo Nakamura, Matsumoto (JP); Yoko Nakamura, Matsumoto (JP)

(73) Assignee: FUJI ELECTRIC CO., LTD., Kasasaki-Shi (JP)

( * ) Notice: Subject to any disclaimer, the term of this patent is extended or adjusted under 35 U.S.C. 154(b) by 0 days.

(21) Appl. No.: 15/062,035

(22) Filed: Mar. 4, 2016

(65) Prior Publication Data

US 2017/0018524 A1    Jan. 19, 2017

(30) Foreign Application Priority Data

Jul. 15, 2015  (JP) .................................. 2015-141314

(51) Int. Cl.
*H01L 23/48* (2006.01)
*H01L 21/00* (2006.01)
(Continued)

(52) U.S. Cl.
CPC ............ *H01L 24/29* (2013.01); *H01L 21/486* (2013.01); *H01L 23/49827* (2013.01); *H01L 23/49833* (2013.01); *H01L 24/83* (2013.01); *H01L 24/97* (2013.01); *H01L 25/0655* (2013.01); *H01L 25/071* (2013.01); *H01L 25/115* (2013.01); *H01L 23/3121* (2013.01); *H01L 23/40* (2013.01); *H01L 25/50* (2013.01); *H01L 2224/29139* (2013.01);
(Continued)

(58) Field of Classification Search
CPC ..... H01L 25/0657; H01L 24/97; H01L 25/50; H01L 25/0655; H01L 24/29; H01L 23/49827; H01L 23/49833; H01L 24/83; H01L 25/071; H01L 25/115; H01L 21/486; H01L 21/5384
See application file for complete search history.

(56) References Cited

U.S. PATENT DOCUMENTS 8,502,385 B2 *  8/2013  Oka ........................ H01L 21/56
                                                         257/170
9,504,154 B2 * 11/2016  Tada .................... H05K 1/0263
(Continued)

FOREIGN PATENT DOCUMENTS

JP    2009-064852 A    3/2009
JP    2014-143342 A    8/2014
WO    WO-2013/136896 A1    9/2013

*Primary Examiner* — Alonzo Chambliss
(74) *Attorney, Agent, or Firm* — Rabin & Berdo, P.C.

(57) ABSTRACT

A semiconductor device includes a plurality of semiconductor units each including a laminated substrate formed by laminating an insulating board and a circuit board and a semiconductor element joined to the circuit board using a joining material which irreversibly makes a phase transition into a solid-phase state. In addition, the semiconductor device may include a base plate to which each of the plurality of semiconductor units is joined using solder and a connection unit which electrically connects the plurality of semiconductor units in parallel.

12 Claims, 4 Drawing Sheets

(51) Int. Cl.
  *H05K 5/00*    (2006.01)
  *H01L 23/00*   (2006.01)
  *H01L 21/48*   (2006.01)
  *H01L 23/498*  (2006.01)
  *H01L 25/065*  (2006.01)
  *H01L 25/07*   (2006.01)
  *H01L 25/11*   (2006.01)
  *H01L 25/00*   (2006.01)
  *H01L 23/31*   (2006.01)
  *H01L 23/40*   (2006.01)

(52) U.S. Cl.
  CPC ............... *H01L 2224/29147* (2013.01); *H01L 2224/32225* (2013.01); *H01L 2224/8384* (2013.01)

(56) References Cited

U.S. PATENT DOCUMENTS

| | | | | |
|---|---|---|---|---|
| 2010/0127371 | A1* | 5/2010 | Tschirbs | H01L 23/13 257/684 |
| 2012/0106086 | A1* | 5/2012 | Schloerke | H01L 25/072 361/715 |
| 2014/0151744 | A1* | 6/2014 | Lee | H01L 25/072 257/144 |
| 2014/0347836 | A1* | 11/2014 | Nakamura | H01L 23/3121 361/764 |
| 2014/0355219 | A1* | 12/2014 | Tada | H01L 24/01 361/729 |
| 2014/0361424 | A1* | 12/2014 | Horio | H02M 7/003 257/704 |
| 2014/0361445 | A1 | 12/2014 | Nashida | |
| 2016/0192495 | A1* | 6/2016 | Nakamura | H01L 23/5227 361/783 |
| 2016/0295690 | A1* | 10/2016 | Takano | H05K 1/0296 |

* cited by examiner

SEMICONDUCTOR DEVICE INCLUDING A CONNECTION UNIT AND SEMICONDUCTOR DEVICE FABRICATION METHOD OF THE SAME

CROSS-REFERENCE TO RELATED APPLICATION

This non-provisional application is based upon and claims the benefit of priority of the prior Japanese Patent Application No. 2015-141314, filed on Jul. 15, 2015, the entire contents of which are incorporated herein by reference.

BACKGROUND OF THE INVENTION

1. Field of the Invention

The embodiment discussed herein is related to a semiconductor device and a semiconductor device fabrication method.

2. Background of the Related Art

Power semiconductor modules (semiconductor devices) include semiconductor elements, such as insulated gate bipolar transistors (IGBTs), power metal oxide semiconductor field effect transistors (MOSFETs), or free wheeling diodes (FWDs), and are widely used as power converters or the like.

Semiconductor devices include a plurality of semiconductor units and increases current capacity. With such semiconductor units, a back electrode of a semiconductor element is joined to metal foil disposed over an insulating board with solder therebetween. In addition, with the semiconductor units, a conductive post soldered to a through hole made in a printed circuit board is joined to a front electrode of the semiconductor element with solder therebetween. These insulating board, semiconductor element, and printed circuit board are sealed by the use of resin to form each semiconductor unit.

Furthermore, these semiconductor units are fixed onto a base plate with solder there between and are housed in a case. By doing so, a semiconductor device is formed.

Please see, for example, Japanese Laid-open Patent Publication No. 2009-64852.

In order to fix a semiconductor unit onto a base plate with solder there between, first a solder plate is disposed over the base plate. Furthermore, the semiconductor unit is disposed over the solder plate. All of them are then heated. By doing so, the solder plate is melted and the semiconductor unit is fixed onto the base plate by the use of solder.

However, when such heating is performed, solder by which metal foil and a semiconductor element included in the semiconductor unit are joined together or solder by which the semiconductor element and a conductive post included in the semiconductor unit are joined together is remelted. Remelted solder reacts with an electrode of the semiconductor element to form an alloy layer. That is to say, an electrode of the semiconductor element is eroded by remelted solder and is consumed (solder erosion). As a result, a deterioration in the quality of the joining of the semiconductor element may lead to a deterioration in the characteristics of the semiconductor unit and therefore to a deterioration in the quality of a semiconductor device.

SUMMARY OF THE INVENTION

According to an aspect, there is provided a semiconductor device including a plurality of semiconductor units each having a laminated substrate formed by laminating an insulating board and a circuit board and a semiconductor element joined to the circuit board by using a joining material which irreversibly makes phase transition into a solid-phase state, a base plate to which each of the plurality of semiconductor units is joined by using solder, and a connection unit which electrically connects the plurality of semiconductor units in parallel.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described with reference to the accompanying drawings, wherein like reference numerals refer to like elements throughout.

First a semiconductor unit according to an embodiment will be described by the use of FIG. 1.

Figure 1:
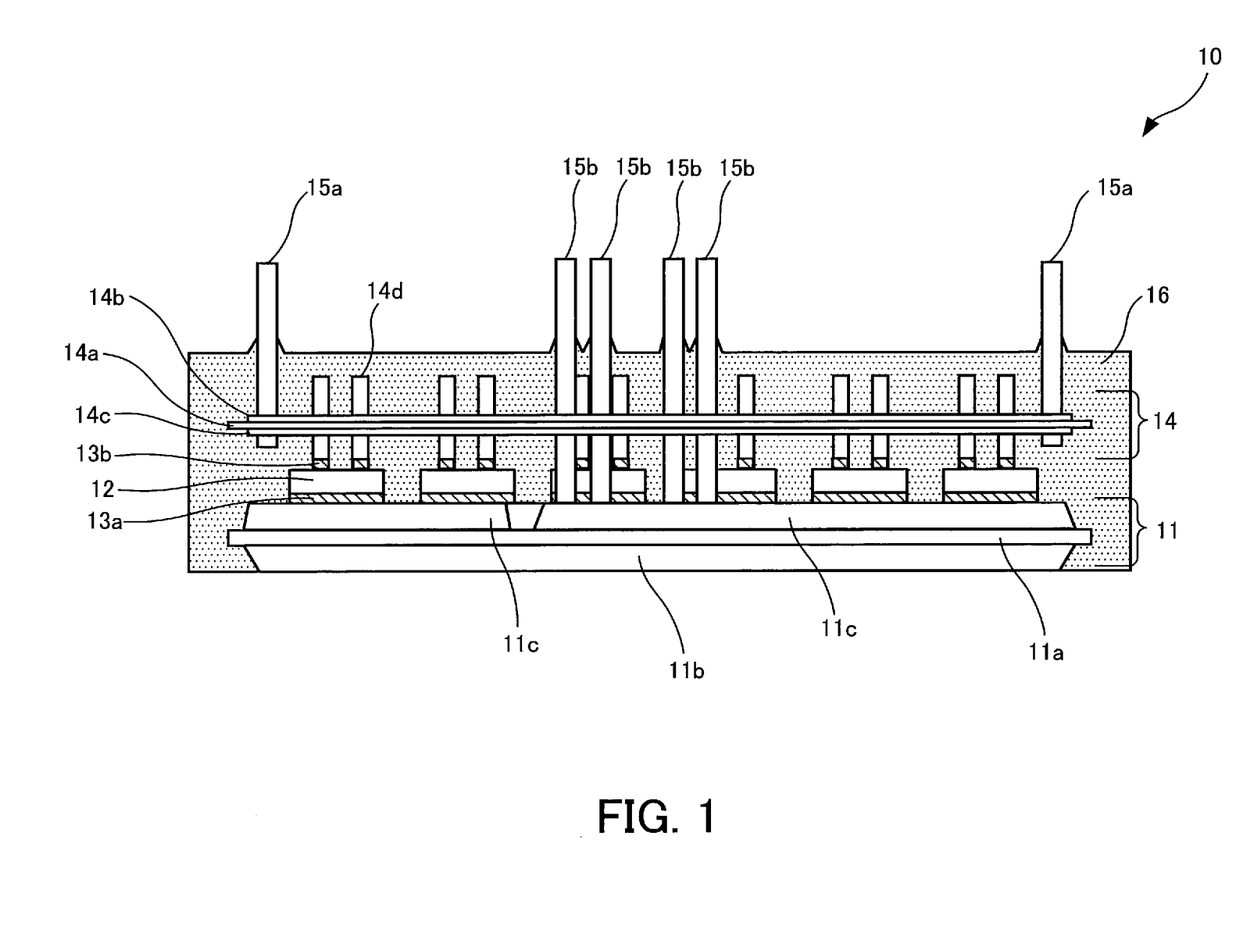
FIG. 1 is a sectional view of a semiconductor unit according to an embodiment.

FIG. 1 is a sectional view of a semiconductor unit according to an embodiment.

A semiconductor unit 10 includes a laminated substrate 11, a semiconductor element 12, a printed circuit board 14, a plurality of control terminals 15a, and a plurality of main terminals 15b which are sealed by the use of resin 16.

The laminated substrate 11 is formed by laminating a circuit board 11c, an insulating board 11a, and a metal board 11b. The metal board 11b is disposed on a back of the insulating board 11a. The circuit board 11c is disposed on a front of the insulating board 11a and has the shape of a pattern corresponding to determined circuits in the semiconductor unit 10. The insulating board 11a is made of an insulating ceramic material such as aluminum nitride, silicon nitride, or aluminum oxide. The metal board 11b and the circuit board 11c are made of copper, aluminum, or the like. A direct copper bond (DCB) substrate, an active metal blazing (AMB) substrate, or the like may be used as the laminated substrate 11.

An IGBT, a MOSFET, a FWD, or the like is properly used as the semiconductor element 12. In addition, a back electrode of the semiconductor element 12 is joined to the circuit board 11c of the laminated substrate 11 by the use of a joining material 13a. The joining material 13a will be described later.

The printed circuit board 14 includes a resin layer 14a and circuit layers 14b and 14c disposed on a front and a back, respectively, of the resin layer 14a. A plurality of conductive posts 14d are formed on the printed circuit board 14 so as to protrude on the front side and the back side of the printed circuit board 14. These conductive posts 14d are electrically connected to the circuit layers 14b and 14c. Furthermore, the conductive posts 14d are fixed to front electrodes (gate, emitter, and source electrodes) of the semiconductor element 12 by the use of a joining material 13b which is made in the same way that is used for making the above joining material 13a. The joining material 13b will be described later.

The plurality of control terminals 15a are fixed to the printed circuit board 14 and are electrically connected to the circuit layers 14b and 14c of the printed circuit board 14. A control signal is inputted from the outside to each control terminal 15a and is outputted to the semiconductor element 12 via the circuit layers 14b and 14c and a conductive post 14d.

The plurality of main terminals 15b pierce through holes (not illustrated) in the printed circuit board 14 and are electrically connected to the circuit board 11c of the laminated substrate 11. The plurality of main terminals 15b are insulated from the printed circuit board 14. The semiconductor element 12 generates output corresponding to an inputted control signal in a state in which each main terminal 15b is connected to an external positive or negative electrode.

The joining materials 13a and 13b irreversibly make phase transition and go into a solid-phase state. Each of the joining materials 13a and 13b irreversibly makes the phase transition from a state at the time of being disposed in a determined joining place to a solid-phase state. Therefore, the melting points of the joining materials 13a and 13b are higher than the melting points of the joining materials 13a and 13b before joining. The joining materials 13a and 13b are, for example, sintered metal bodies. Furthermore, silver or copper is taken as a concrete example of metal contained in such a sintered metal body.

Next, a semiconductor device in which the above semiconductor unit 10 is included in plurality will be described by the use of FIGS. 2 and 3.

Figure 2:
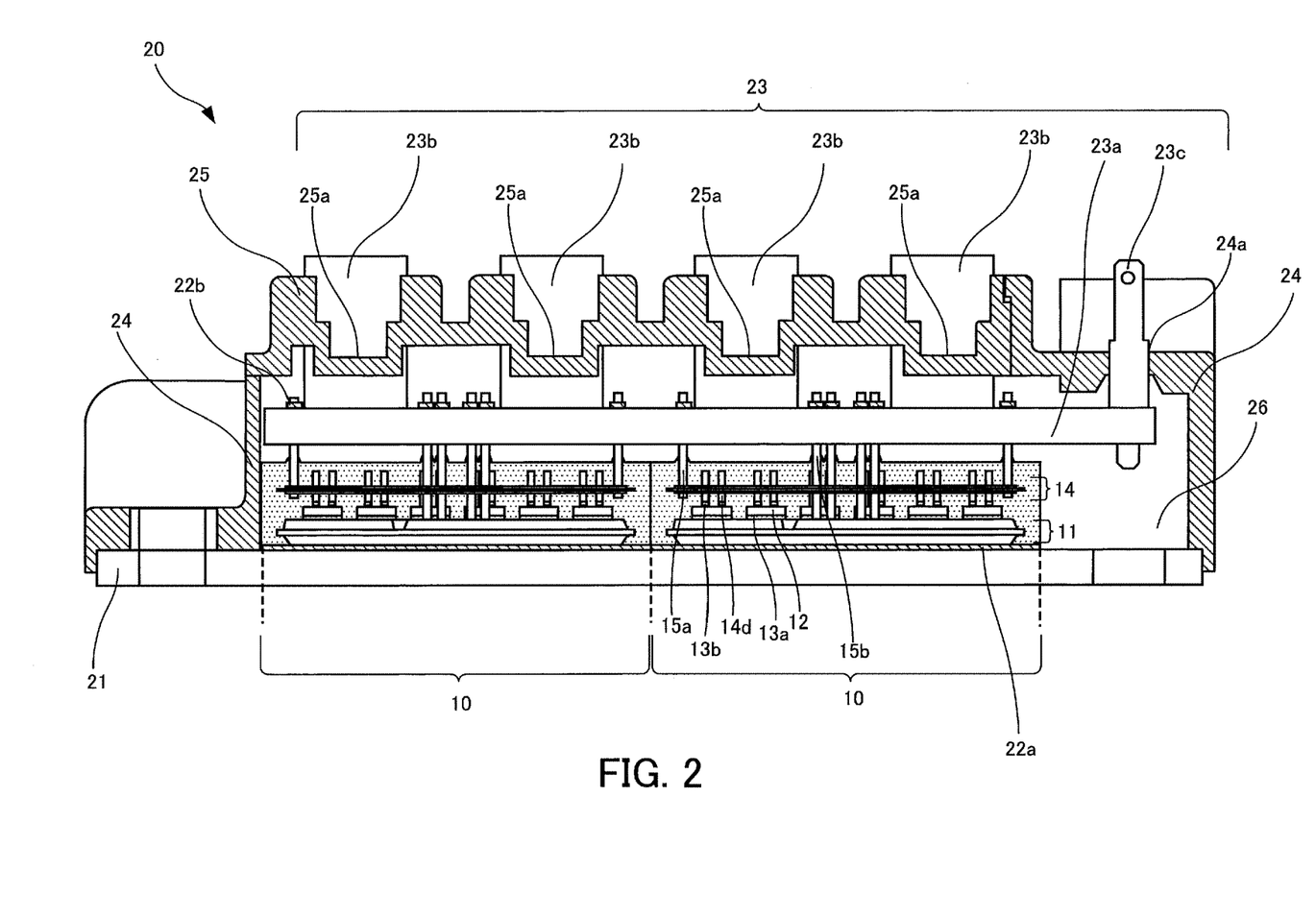
FIG. 2 is a sectional view of a semiconductor device according to the embodiment.
Figure 3:
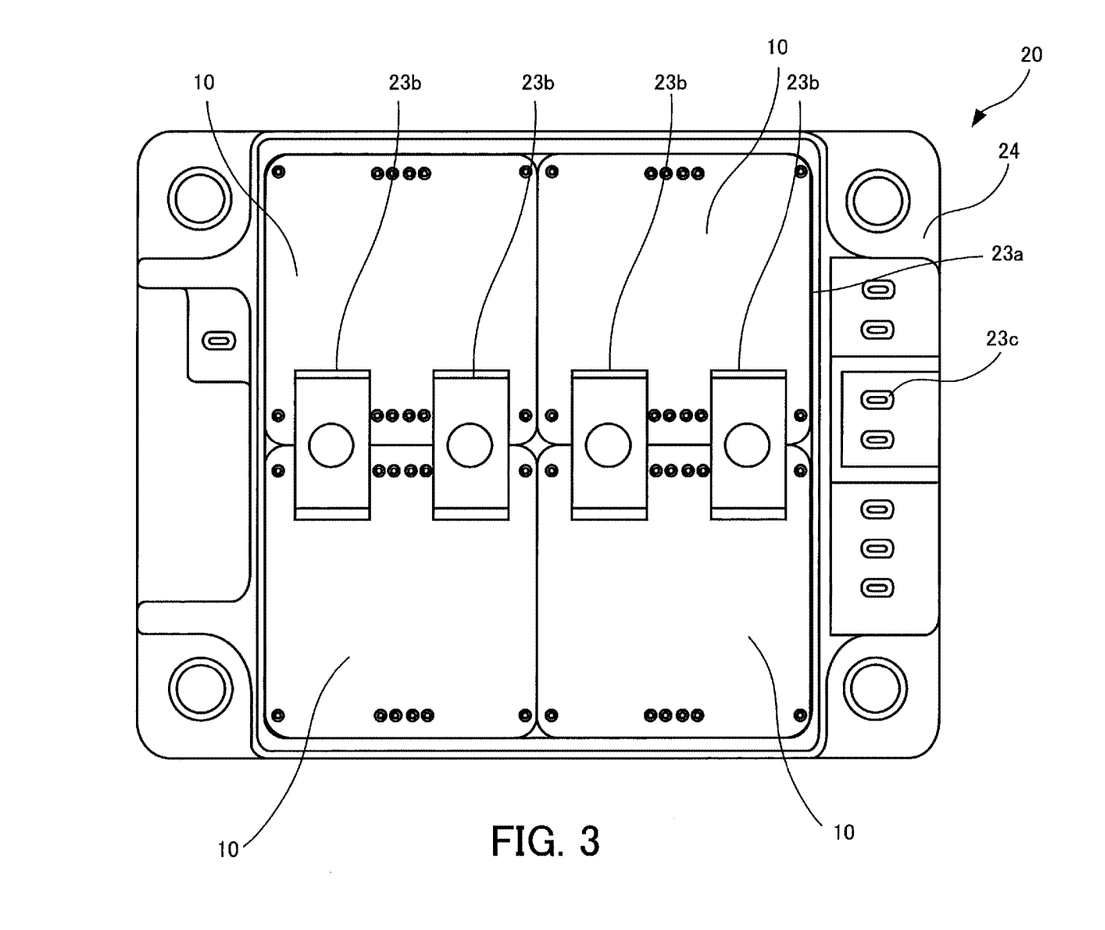
FIG. 3 is a plan view of the semiconductor device according to the embodiment.

FIG. 2 is a sectional view of a semiconductor device according to the embodiment. FIG. 3 is a plan view of the semiconductor device according to the embodiment. In FIG. 3, a lid 25 described later is taken off and a connection unit 23 is exposed. Furthermore, in FIG. 3, the arrangement of the semiconductor units 10 is indicated by solid lines.

As illustrated in FIG. 2, a semiconductor device 20 includes a plurality of semiconductor units 10, a base plate 21, and the connection unit 23. Furthermore, each semiconductor unit 10 is joined to the base plate 21 by the use of solder 22a. In addition, the connection unit 23 is joined to control terminals 15a and main terminals 15b of each semiconductor unit 10 by the use of solder 22b. Moreover, the plurality of semiconductor units 10 are electrically connected in parallel by the connection unit 23. As illustrated in FIG. 3, in this embodiment the semiconductor device 20 includes four semiconductor units 10 arranged in two rows and two columns.

The base plate 21 is made of metal, such as copper or aluminum, having high thermal conductivity.

The connection unit 23 includes a printed circuit board 23a, external connection terminals 23b, and external control terminals 23c. The printed circuit board 23a is formed by laminating a plurality of circuit layers (not illustrated) and a plurality of insulating layers (not illustrated). In addition, the external connection terminals 23b are electrically connected to the corresponding circuit layers of the printed circuit board 23a. Furthermore, the external control terminals 23c are electrically connected to the corresponding circuit layers of the printed circuit board 23a. Each external connection terminal 23b is electrically connected to a main terminal 15b of a semiconductor unit 10 via a corresponding circuit layer of the printed circuit board 23a. Moreover, each external control terminal 23c is electrically connected to a control terminal 15a of a semiconductor unit 10 via a corresponding circuit layer of the printed circuit board 23a.

A case 24 exposes a back of the base plate 21 and encloses the outside of each of the other components. Furthermore, the lid 25 covers an upper part of the connection unit 23 and each component is housed inside the case 24 and the lid 25. Each external connection terminal 23b protrudes from an opening 25a of the lid 25 and each external control terminal 23c protrudes from an opening 24a of the case 24. Furthermore, a space inside the case 24 and the lid 25 is filled with resin 26 to seal the base plate 21, the semiconductor units 10, and the connection unit 23 by the use of the resin 26. Each external control terminal 23c is connected to an external apparatus by the use of, for example, a nut (not illustrated) embedded in the lid 25 and a bolt which can be fixed with the nut. In that case, a hole made in the external control terminal 23c is aligned with a threaded hole made in the nut and the bolt is put through them to fix it.

A method for fabricating the semiconductor device 20 having the above structure will now be described by the use of FIGS. 1, 2, and 4.

Figure 4:
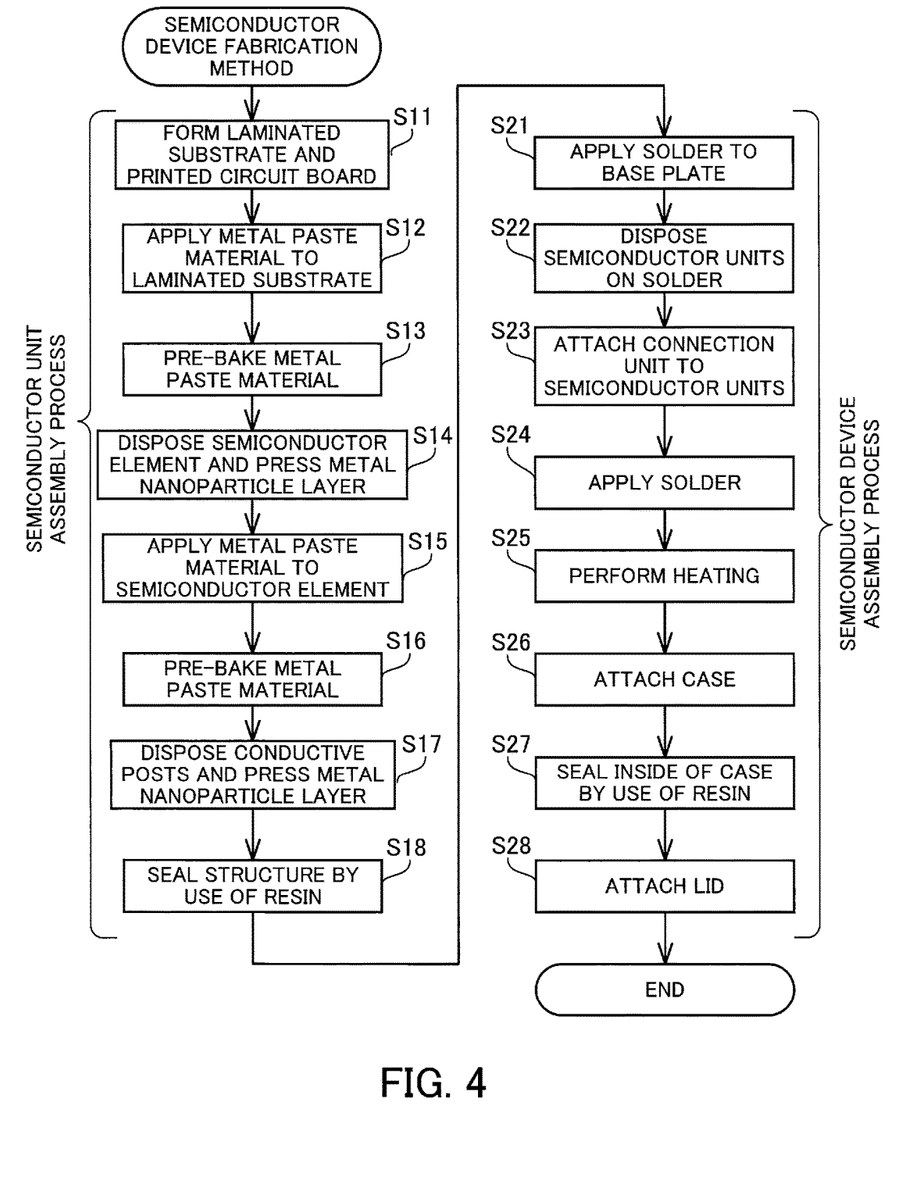
FIG. 4 is a flow chart of a method for fabricating the semiconductor device according to the embodiment.

FIG. 4 is a flow chart of a method for fabricating the semiconductor device according to the embodiment.

A method for fabricating the semiconductor device 20 is roughly divided into a process for assembling the semiconductor unit 10 (steps S11 through S18) and a process for assembling the semiconductor device 20 by the use of the semiconductor unit 10 (steps S21 through S28).

First a process for assembling the semiconductor unit 10 will be described.

(Step S11) The laminated substrate 11 and the printed circuit board 14 are formed.

With the laminated substrate 11, the metal board 11b is formed on the back of the insulating board 11a and the circuit board 11c having a determined pattern is formed on the front of the insulating board 11a.

With the printed circuit board 14, the circuit layers 14b and 14c each having a determined pattern are formed on the front and the back, respectively, of the resin layer 14a. Furthermore, the conductive posts 14d and the control terminals 15a are formed so that they will be electrically connected to the circuit layers 14b and 14c.

(Step S12) A metal paste material is applied to a region (hereinafter referred to as the element mounting region) of the circuit board 11c of the laminated substrate 11 on which the semiconductor element 12 is to be mounted.

The metal paste material is a solvent in which metal nanoparticles are dispersed. The metal nanoparticles are, for example, copper or silver nanoparticles.

(Step S13) The laminated substrate 11 is heated (pre-baked) to evaporate the solvent from the metal paste material.

The solvent evaporates by the pre-bake and a metal nanoparticle layer in which metal nanoparticles flocculate nanoporously is formed on the element mounting region of the laminated substrate 11.

(Step S14) The semiconductor element 12 is disposed over the element mounting region on which the metal nanoparticle layer is formed. While heating is being performed at a temperature of about 250° C. higher than temperature at which the pre-bake is performed, the metal nanoparticle layer is pressed.

By pressing the metal nanoparticle layer while performing heating in this way, metal nanoparticles flocculate, are sintered, and make phase transition to a solid-phase state, between the back of the semiconductor element 12 and the element mounting region of the laminated substrate 11. As a result of this sintering, the joining material 13a which is a strong sintered metal body is formed between the semiconductor element 12 and the laminated substrate 11. The joining material 13a formed in this way is a sintered metal body. Therefore, its melting point is equal to that of metal (in the case of silver, for example, the melting point of the joining material 13a is about 960° C.) used as a base material. That is to say, the melting point of the joining material 13a is substantially higher than that of solder (about 250° C.).

The semiconductor element 12 is fixed in this way to the laminated substrate 11.

(Step S15) A metal paste material is applied to regions of the semiconductor element 12 where the conductive posts 14d are to be joined. This is the same with step S12.

(Step S16) The laminated substrate 11 is heated (pre-baked) to evaporate a solvent from the metal paste material. This is the same with step S13. As a result, a metal nanoparticle layer is formed on the semiconductor element 12.

(Step S17) End portions of the conductive posts 14d fixed to the printed circuit board 14 are disposed over the regions of the semiconductor element 12 to which the conductive posts 14d are to be joined and on which the metal nanoparticle layer is formed. While heating is being performed at a temperature of about 250° C. higher than temperature at which the pre-bake is performed, the metal nanoparticle layer is pressed. This is the same with step S14.

By pressing the metal nanoparticle layer while performing heating in this way, metal nanoparticles flocculate, are sintered, and make phase transition to a solid-phase state, between the end portions of the conductive posts 14d and the regions of the semiconductor element 12 to which the conductive posts 14d are joined. As a result of this sintering, the joining material 13b which is a strong sintered metal body is formed between the semiconductor element 12 and the conductive posts 14d. The joining material 13b formed in this way is a sintered metal body. Therefore, its melting point is substantially higher than that of solder. This is the same with the joining material 13a.

As a result, the conductive posts 14d are fixed to the semiconductor element 12 and the printed circuit board 14 is disposed opposite the laminated substrate 11.

After that, the main terminals 15b are inserted into through holes (not illustrated) made in the printed circuit board 14, and are electrically connected to the circuit board 11c of the laminated substrate 11. The joining material 13a or 13b which is a sintered metal body is also suitable for joining the main terminals 15b and the circuit board 11c together.

Alternatively, the main terminals 15b may be held in advance by the printed circuit board 14 by press-fitting. In that case, the main terminals 15b and the circuit board 11c are joined together at the same time that the semiconductor element 12 and the conductive posts 14d are joined together.

(Step S18) A structure assembled in steps S11 through S17 is sealed by the use of the resin 16, such as epoxy resin, so that the control terminals 15a and the main terminals 15b will protrude from the resin 16. As a result, the semiconductor unit 10 (FIG. 1) is obtained.

The process for assembling the semiconductor unit 10 has ended.

Next, a process for assembling the semiconductor device 20 will be described.

(Step S21) The solder 22a is applied to semiconductor unit mounting regions of the base plate 21.

(Step S22) The semiconductor unit 10 fabricated in steps S11 through S18 is disposed in plurality on the solder 22a applied.

(Step S23) The connection unit 23 is attached to the plurality of semiconductor units 10 disposed.

At this time the control terminals 15a and the main terminals 15b of the semiconductor units 10 are made to pierce the printed circuit board 23a of the connection unit 23 at determined spots. Furthermore, end portions of the control terminals 15a and the main terminals 15b are made to protrude from the printed circuit board 23a.

(Step S24) The solder 22b is applied to the end portions of the control terminals 15a and the main terminals 15b which protrude from the printed circuit board 23a.

(Step S25) The whole is heated to melt the solder 22a and 22b applied in steps S21 and S24 respectively. Heating temperature is set to temperature (about 300° C., for example) which is higher than the melting point of solder to sufficiently melt the solder 22a and 22b. Furthermore, the whole is cooled to solidify the solder 22a and 22b.

As a result, the semiconductor units 10 and the base plate 21 are joined together and the control terminals 15a and the main terminals 15b and the printed circuit board 23a are joined together.

When the whole is heated at the above temperature, the joining material 13a or 13b which is a sintered metal body is not melted in the semiconductor units 10. Therefore, the erosion of an electrode of each semiconductor element 12 is prevented.

(Step S26) The case 24 is attached so as to enclose the base plate 21, the semiconductor units 10, and the connection unit 23. At this time, the external control terminals 23c of the connection unit 23 are made to protrude from openings 24a of the case 24 to the outside, and the back of the base plate 21 is exposed.

(Step S27) Resin (or gel) is injected into inner space enclosed by the case 24 attached in step S26. By doing so, the base plate 21, the semiconductor units 10, and the connection unit 23 are sealed by the use of the resin 26.

(Step S28) The lid 25 is attached to the connection unit 23 from above. At this time the external connection terminals 23b of the connection unit 23 are made to extrude from the openings 25a in the lid 25 to the outside. As a result, the semiconductor device 20 (FIG. 2) is obtained.

The process for assembling the semiconductor device 20 has ended.

As has been described, each semiconductor element 12 in the semiconductor units 10 is joined by the use of a joining material which irreversibly makes phase transition into a solid-phase state. This prevents the erosion of an electrode of each semiconductor element 12. Therefore, a deterioration in the quality of the semiconductor device 20 is suppressed and the yield rate of the assembly of the semiconductor devices 20 is improved.

Even if each semiconductor element 12 is joined by the use of high melting point solder (whose melting point is, for example, 400° C.), the erosion of an electrode caused by remelting is prevented. In this case, however, each semiconductor element 12 is joined at a temperature of 400° C. or higher. Therefore, when each semiconductor element 12 is joined by the use of high melting point solder, excessive thermal stress remains behind in the laminated substrate 11 or the printed circuit board 14 included in each semiconductor unit 10. In addition, the resin layer 14a of the printed circuit board 14 may be degraded. As a result, it is feared that the reliability of each semiconductor unit 10 deteriorates.

In this embodiment, however, each semiconductor unit 10 is joined at a temperature of about 250° C. As a result, the above problems do not arise and the semiconductor unit 10 with high reliability is fabricated.

The present invention is not limited to the above embodiment. For example, the present invention includes a structure in which the base plate 21 is not included and in which a laminated substrate 11 of each semiconductor unit 10 is exposed directly from a back of a semiconductor device. In this case, the erosion of an electrode of each semiconductor element 12 is also prevented when solder 22b is used for joining a plurality of semiconductor units 10 and a connection unit 23 together.

Furthermore, a semiconductor device fabrication method used in this case differs from the semiconductor device fabrication method according to the above embodiment in that it does not include the above step S21 or S22.

According to the disclosed technique, a deterioration in the quality of a semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a plurality of semiconductor units each including:
    a laminated substrate formed by laminating an insulating board and a circuit board;
    a semiconductor element joined to the circuit board by using a first joining material which irreversibly makes a phase transition into a solid-phase state, the semiconductor element having a main electrode;
    a conductive post whose end portion is joined to the main electrode of the semiconductor element by using a second joining material which irreversibly makes a phase transition into a solid-phase state; and
    a printed circuit board disposed at a side of the semiconductor element, opposite to a side in which the circuit board is disposed;
a base plate to which each of the plurality of semiconductor units is joined by using solder; and
a connection unit which electrically connects the plurality of semiconductor units in parallel.

2. The semiconductor device according to claim 1, wherein the connection unit and each semiconductor unit of the plurality of semiconductor units are joined together by using solder.

3. The semiconductor device according to claim 1, wherein each of the first and second joining materials is a sintered metal body.

4. The semiconductor device according to claim 3, wherein the sintered metal body contains silver or copper.

5. A semiconductor device, comprising:
a plurality of semiconductor units, each semiconductor unit including:
    a laminated substrate formed by laminating an insulating board and a circuit board; and
    a semiconductor element joined to the circuit board by using a first joining material which irreversibly makes a phase transition into a solid-phase state, the semiconductor element having a main electrode;
    a conductive post whose end portion is joined to the main electrode of the semiconductor element by using a second joining material which irreversibly makes a phase transition into a solid-phase state; and
    a printed circuit board disposed at a side of the semiconductor element, opposite to a side in which the circuit board is disposed; and
a connection unit to which each semiconductor unit of the plurality of semiconductor units is joined by using solder and which electrically connects the plurality of semiconductor units in parallel.

6. The device according to claim 5, wherein the first and second joining materials each have a higher melting point after irreversibly making the phase transition into the solid-phase state compared to a melting point of each of the first and second joining materials before irreversibly making the phase transition into the solid-phase state.

7. The device according to claim 5, wherein a melting point of each of the first and second joining materials is higher than that of solder.

8. A method of fabricating a semiconductor device, comprising:
providing a plurality of insulated boards, a plurality of circuit boards, and a plurality of semiconductor elements;
forming a plurality of laminated substrates, each laminated substrate of the plurality of laminated substrates being formed by laminating one insulated board of the plurality of insulated boards and one circuit board of the plurality of circuit boards;
forming a plurality of semiconductor units, each semiconductor unit being formed by joining one semiconductor element of the plurality of semiconductor elements to one circuit board of one of the laminated substrates using a first joining material which irreversibly makes a phase transition into a solid-phase state and by joining an end portion of a conductive post to a main electrode of the semiconductor element using a second joining material which irreversibly makes a phase transition into a solid-phase state;
joining each semiconductor unit of the plurality of semiconductor units to a metal base using solder; and
electrically connecting the plurality of semiconductor units in parallel using a connection unit.

9. The method of fabricating a semiconductor device according to claim 8,
wherein a metal paste material which contains metal particles is applied to each respective circuit board of the plurality of circuit boards, and
wherein the metal paste material of each circuit board is pressed with a respective one semiconductor element of the plurality of semiconductor elements joined to the respective circuit board so that the metal paste material makes an irreversible phase transition to the first joining material.

10. A method of fabricating a semiconductor device, comprising:
providing a plurality of insulated boards, a plurality of circuit boards, and a plurality of semiconductor elements;
forming a plurality of laminated substrates, each laminated substrate of the plurality of laminated substrates being formed by laminating one insulated board of the plurality of insulated boards and one circuit board of the plurality of circuit boards;

forming a plurality of semiconductor units, each semiconductor unit being formed
by joining one semiconductor element of the plurality of semiconductor elements to one circuit board of one of the laminated substrates using a first joining material which irreversibly makes a phase transition into a solid-phase state and
by joining an end portion of a conductive post to a main electrode of the semiconductor element using a second joining material which irreversibly makes a phase transition into a solid-phase state; and
joining each semiconductor unit of the plurality of semiconductor units to a connection unit using solder to electrically connect the plurality of semiconductor units in parallel using the connection unit.

11. The method of fabricating a semiconductor device according to claim 10, wherein the forming a plurality of semiconductor units includes heating the first and second joining materials to irreversibly make the phase transition into the solid-phase state such that the first and second joining materials each have a higher melting point after irreversibly making the phase transition into the solid-phase state compared to a melting point of the first and second joining materials before irreversibly making the phase transition into the solid-phase state.

12. The method of fabricating a semiconductor device according to claim 10, wherein a melting point of each of the first and second joining materials is higher than that of solder.

\* \* \* \* \*